US00RE40082E

(19) United States
(12) Reissued Patent
Nordgren et al.

(10) Patent Number: US RE40,082 E
(45) Date of Reissued Patent: Feb. 19, 2008

(54) COATED INSERTS FOR ROUGH MILLING

(75) Inventors: Anders Nordgren, Enskededalen (SE); Ingemar Hessman, Sandviken (SE); Marian Mikus, Skärholmen (SE)

(73) Assignee: Sandvik Intellectual Property AB, Sandviken (SE)

(21) Appl. No.: 11/449,010
(22) Filed: Jun. 8, 2006

Related U.S. Patent Documents

Reissue of:
(64) Patent No.: 6,767,583
Issued: Jul. 27, 2004
Appl. No.: 10/639,521
Filed: Aug. 13, 2003

U.S. Applications:
(62) Division of application No. 09/984,145, filed on Oct. 29, 2001, now Pat. No. 6,638,609.

(30) Foreign Application Priority Data

Nov. 8, 2000 (SE) ..... 0004079

(51) Int. Cl.
*C23C 16/00* (2006.01)
*B23B 27/14* (2006.01)

(52) U.S. Cl. ..... 427/255.28; 409/64; 409/84; 427/249.17; 427/249.19; 427/255.22; 427/255.23; 427/255.36

(58) Field of Classification Search ..... 427/249.17, 427/249.19, 255.22, 255.23, 255.28, 255.36; 409/64, 84
See application file for complete search history.

(56) References Cited

U.S. PATENT DOCUMENTS

| | | | |
|---|---|---|---|
| 5,674,564 | A | 10/1997 | Ljungberg et al. |
| 5,861,210 | A | 1/1999 | Lenander et al. |
| 5,863,640 | A | 1/1999 | Ljungberg et al. |
| 5,912,051 | A | 6/1999 | Olsson et al. |
| 6,062,776 | A | 5/2000 | Sandman et al. |
| 6,177,178 | B1 | 1/2001 | Ostlund et al. |
| 6,406,224 | B1 | 6/2002 | Ostlund et al. |

FOREIGN PATENT DOCUMENTS

WO WO 01/16388 A1 3/2001

*Primary Examiner*—Archene Turner
(74) *Attorney, Agent, or Firm*—Drinker Biddle & Reath LLP

(57) ABSTRACT

Coated milling insert has a WC—Co cemented carbide with a low content of cubic carbides and a highly W-alloyed binder phase and a coating including an inner layer of $TiC_xN_y$ with columnar grains followed by a layer of $\kappa$-$Al_2O_3$ and a top layer of TiN. The coated milling insert is particularly useful for milling of grey cast iron with or without cast skin under wet conditions at low and moderate cutting speeds and milling of nodular cast iron and compacted graphite iron with or without cast skin under wet conditions at moderate cutting speeds.

17 Claims, No Drawings

COATED INSERTS FOR ROUGH MILLING

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 6,767,583 B2 filed on Aug. 13, 2003, which is a divisional application of U.S. Pat. No. 6,638,609 B2, filed on Oct. 29, 2001, which claims the benefit of priority to Swedish Application No. 0004079-0 filed Nov. 8, 2000.*

This application is a divisional of application Ser. No. 09/984,145, filed on Oct. 29, 2001, now U.S. Pat. No. 6,638,609.

This application claims priority under 35 U.S.C. §§119 and/or 365 to Application No. 004079-0 filed in Sweden on Nov. 8, 2001, the entire content of which is hereby incorporated by reference.

BACKGROUND

1. Field of the Invention

The present invention relates to coated cemented carbide cutting tool inserts, particularly useful for milling of grey cast under wet conditions, preferably at low and moderate cutting speeds but also for milling of nodular cast iron and compacted graphite iron under wet conditions at moderate cutting speeds.

2. Background of the Invention

It is well known that for cemented carbide cutting tool inserts used in the machining of cast irons, the cutting edge is worn by different wear mechanisms such as chemical and abrasive wear but the cutting edge is generally also subjected to crack formation due to the intermittent cutting load, resulting in so called chippings and edge fractures caused by different types of cracks in the inserts.

Different types of crack patterns may appear during machining of cast irons. One important type is the so called comb cracks, which are formed perpendicularly to the cutting edge. The formation of comb cracks is strongly influenced by the cooling conditions during cutting. In particular, the use of fluid coolant increases the tendency to form comb cracks, often also called thermal cracks. The use of fluid coolant leads to large temperature gradients and thermal tensile stresses in the insert surface, increasing the tendency for formation of surface cracks, in particular in the case of coated cutting tool inserts where the hard but brittle ceramic surface coating is prone to crack under conditions involving unfavourable thermal tensile stresses. Cracks in the coating increases the risk for chipping and edge fractures and for flaking of the coating.

Characteristic for cast irons is the so called surface skin, the surface zone of the cast component often contains a structure which deviates considerably from the bulk structure and also contains hard inclusion and sand from the mould. In this case, a coated cemented carbide insert must be used including a substrate with the proper toughness of the cemented carbide grade and on the surface a wear resistant refractory coating.

Furthermore, different cutting conditions such as cutting speed, depth of cut, cutting feed rate and also external factors such as vibrations of the work piece and the above mentioned surface zone in iron casting, etc., require a plurality of different properties of the cutting edge.

Commercial cemented carbide tool inserts for milling of cast irons under wet conditions are usually optimised with respect to one or two of the wear types observed.

U.S. Pat. No. 5,912,051 discloses a coated cutting insert particularly useful for dry milling of grey cast iron.

U.S. Pat. No. 5,863,640 discloses a coated turning insert particularly useful for intermittent turning in low alloyed steel.

In U.S. Pat. No. 6,062,776 is disclosed a coated cemented carbide cutting tool particularly designed for the wet and dry milling of workpieces of low and medium alloyed steels or stainless steels, with or without abrasive surface zones, in machining operations requiring a high degree of toughness of the carbide cutting edge. The external cutting conditions are characterised by complex shapes of the workpiece, vibrations, chip hammering, recutting of the chips etc.

In U.S. Pat. No. 6,177,178 is disclosed a coated cemented carbide cutting tool particularly designed for the wet and dry milling of low and medium alloyed steels.

WO 01/16388 discloses a coated insert particularly useful for milling in low and medium alloyed steels with or without abrasive surface zones during dry or wet conditions at high cutting speed, and milling hardened steels at high cutting speed.

DETAILED DESCRIPTION OF PREFERRED EMBODIMENTS

It has now surprisingly been found that by combining many different features cutting tool inserts, preferably for milling, can be obtained with excellent cutting performance when milling grey cast iron using fluid coolant at low and moderate cutting speeds as well as in milling of nodular and compacted graphite iron using fluid coolant at moderate cutting speeds, in iron castings with or without cast skin.

The cutting tool inserts according to the invention show improved properties with respect to the different wear types prevailing at these cutting conditions as earlier mentioned.

The cutting tool inserts according to the invention consist of: a cemented carbide body with a relatively high W-alloyed binder phase and with a well balanced chemical composition and grain size of the WC, a columnar $TiC_xN_y$-layer, a κ-$Al_2O_3$-layer, a TiN-layer and optionally followed by smoothening the cutting edges by brushing the edges.

According to the present invention coated cutting tool inserts are provided consisting of a cemented carbide body with a composition of 7.3–7.9 wt. % Co, preferably 7.6 wt. % Co, 1.0–1.8 wt. % cubic carbides, preferably 1.4–1.7 wt. % cubic carbides of the metals Ta and Nb and balance WC. The average grain size of the WC is in the range of about 1.5–2.5 μm, preferably about 1.8 μm.

The cobalt binder phase is rather highly alloyed with W. The content of W in the binder phase can be expressed as the CW-ratio:

$$\text{CW-ratio}=Ms/(\text{wt \% Co} \times 0.0161)$$

where Ms is the saturation magnetization of the cemented carbide body in [kA/m] $hAm^2/kg$ and wt. % Co is the weight percentage of Co in the cemented carbide. The CW-value is a function of the W content in the Co binder phase. A high CW-value corresponds to a low W-content in the binder phase.

It has now been found according to the present invention that improved cutting performance is achieved if the cemented carbide body has a CW-ratio of 0.86–0.94. The cemented carbide may contain small amounts, <3 vol. %, of η-phase ($M_6C$), without any detrimental effect.

The coating comprises

- a first (innermost) layer of $TiC_xN_yO_z$ with x+y+z=1, y>x and z<0.2, preferably y>0.8 and z=0, with equiaxed grains with size <0.5 μm and a total thickness <1.5 μm preferably >0.1 μm.
- a layer of $TiC_xN_y$ with x+y=1, x>0.3 and y>0.3, preferably x≧0.5, with a thickness of 1–4 μm, preferably 2–2.7 μm, with columnar grains and with an average diameter of <5 μm, preferably 0.1–2 μm.
- a layer of smooth, fine-grained (grain size about 0.5–2 μm) $Al_2O_3$ consisting essentially of the κ-phase. However, the layer may contain small amounts (<5 vol. %) of other phases such as η- or the α-phase as determined by XRD-measurement. The $Al_2O_3$-layer has a thickness of 1–2.5 μm, preferably 1.2–1.7 μm.
- a further 0.5–1.0 μm thick layer of TiN. This outermost layer of TiN has a surface roughness Rmax≦0.4 μm over a length of 10 μm. The TiN-layer is preferably removed along the cutting edge and the underlying alumina layer may be partly or completely removed along the cutting edge.

The present invention also relates to a method of making coated cutting tool inserts consisting of a cemented carbide body with a composition of 7.3–7.9 wt. % Co, preferably 7.6 wt. % Co, 1.0–1.8 wt. % cubic carbides, preferably 1.4–1.7 wt. % cubic carbides of the metals Ta and Nb and balance WC. The average grain size of the WC is in the range of about 1.5–2.5 μm, preferably about 1.8 μm. Onto the cemented carbide body is deposited.

- a first (innermost) layer of $TiC_xN_yO_z$ with x+y+z=1, y>x and z<0.2, preferably y>0.8 and z=0, with equiaxed grains with size <0.5 μm and a total thickness <1.5 μm preferably >0.1 μm using known CVD-methods.
- a layer of $TiC_xN_y$ with x+y=1, x>0.3 and y>0.3, preferably x≧0.5, with a thickness of 1–4 μm, preferably 2–2.7 μm, with columnar grains and with an average diameter of <5 μm, preferably 0.1–2 μm using preferably MTCVD-technique (using acetonitrile as the carbon and nitrogen source for forming the layer in the temperature range of 700–900° C.). The exact conditions, however, depend to a certain extent on the design of the equipment used.
- a smooth $Al_2O_3$-layer essentially consisting of κ-$Al_2O_3$ is deposited under conditions disclosed in e.g. U.S. Pat. No. 5,674,564. The $Al_2O_3$ layer has a thickness of 1–2.5 μm, preferably 1.2–1.7 μm.
- a 0.5–1.0 μm thick layer of TiN with a surface roughness Rmax≦0.4 μm over a length of 10 μm.

The smooth coating surface is obtained by a gentle wet-blasting the coating surface with fine grained (400–150 mesh) alumina powder or by brushing the edges with brushes based on e.g. SiC as disclosed e.g. in U.S. Pat. No. 5,861,210. The TiN-layer is preferably removed along the cutting edge and the underlying alumina layer may be partly or completely removed along the cutting edge.

The invention also relates to the use of cutting tool inserts according to above for wet milling using fluid coolant of cast irons such as grey cast iron, compacted graphite iron and nodular iron particularly grey cast iron at a cutting speed of 70–180 m/min and a feed of 0.1–0.4 μm/tooth depending on cutting speed and insert geometry.

EXAMPLE 1

A. Cemented carbide milling inserts in accordance with the invention with the composition 7.6 wt. % Co, 1.25 wt. % TaC, 0.30 wt. % NbC and balance WC with average grain size of 1.8 μm, with a binder phase alloyed with W corresponding to a CW-ratio of 0.87 were coated with a 0.5 μm equiaxed $TiC_{0.05}N_{0.95}$-layer (with a high nitrogen content corresponding to an estimated C/N-ratio of 0.05) followed by a 2.6 μm thick $TiC_{0.54}N_{0.46}$-layer, with columnar grains by using MTCVD-technique (temperature 850–885° C. and $CH_3CN$ as the carbon/nitrogen source). In subsequent steps during the same coating cycle, a 1.3 μm thick layer of $Al_2O_3$ was deposited using a temperature 970° C. and a concentration of $H_2S$ dopant of 0.4% as disclosed in U.S. Pat. No. 5,674,564. A thin (0.5 μm) layer of TiN was deposited on top according to known CVD-technique. XRD-measurement showed that the $Al_2O_3$-layer consisted of 100% κ-phase.

The coated inserts were brushed using a nylon straw brush containing SiC grains. Examination of the brushed inserts in a light optical microscope revealed that the outermost, thin TiN-layer and some of the $Al_2O_3$-layer had been brushed away along the very cutting edge, leaving there a smooth $Al_2O_3$-surface. Coating thickness measurements on cross sectioned, brushed inserts showed that the outermost TiN-layer and roughly half the $Al_2O_3$-layer had been removed along the edge line.

B. Commercial cemented carbide milling inserts with the composition 9 wt. % Co, 1.23 wt. % TaC, 0.30 wt. % NbC and balance WC with a WC grain size in average of 1.7 μm, with a binder phase alloyed with W corresponding to a CW-ratio of 0.92 were coated with an innermost 0.5 μm equiaxed TiN-layer followed by a 5.5 μm thick Ti(C,N)-layer, with columnar grains by using MTCVD-technique and outermost a 4 μm thick layer of $Al_2O_3$. XRD-measurement showed that the $Al_2O_3$-layer consisted of 100% α-phase.

C. Cemented carbide milling inserts with the composition 6 wt. % Co and balance WC with average grain size 1.8 μm, with a binder phase alloyed with W corresponding to a CW-ratio of 0.90 were coated with a 2 μm thick TiC-layer using known CVD-technique. In subsequent steps during the same coating cycle, a 1 μm thick layer of $Al_2O_3$ was deposited.

Inserts from A, B and C were tested in face milling of grey cast iron cylinder heads.

| | |
|---|---|
| Operation: | Face milling - roughing |
| Work-piece: | Cylinder head |
| Material: | Peailitic grey cast iron, alloyed, |
| Cutting speed: | 116 in/min |
| Feed rate/tooth: | 0.32 μm/rev. |
| Depth of cut: | 2 μm |
| Insert-style: | TNEF 1204AN-CA |
| Note: | Wet, single tooth milling |
| Results: | Tool-life, number of passes per edge |
| Grade A: (invention) | 99 |
| Grade B: (prior art) | 60 |
| Grade C: (prior art) | 49 |

Tool-life criterion was chippings and fractures of the edges.

EXAMPLE 2

D. Cemented carbide milling inserts in accordance with the invention with the composition 7.6 wt. % Co, 1.25 wt. % TaC, 0.30 wt. % NbC and balance WC with an average grain size of 1.75 μm, with a binder phase alloyed with W corresponding to a CW-ratio of 0.88 were coated with a 0.5 μm equiaxed $TiC_{0.05}N_{0.095}$-layer (with a high nitrogen content corresponding to an estimated C/N-ratio of 0.05) followed by a 2.0 μm thick $TiC_{0.54}N_{46}$-layer, with columnar grains by using MTCVD-technique (temperature 850–885° C. and $CH_3CN$ as the carbon/nitrogen source). In subsequent steps during the same coating cycle, a 1.4 μm thick layer of $Al_2O_3$ was deposited using a temperature 970° C. and a concentration of $H_2S$ dopant of 0.4% as disclosed in U.S. Pat. No. 5,674,564. A thin (0.5 μm) layer of TiN was deposited on top according to known CVD-technique. XRD-measurement showed that the $Al_2O_3$-layer consisted of 100% κ-phase.

The coated inserts were brushed using a nylon straw brush containing SiC grains. Examination of the brushed inserts in a light optical microscope showed that the outermost, thin TiN-layer and some of the $Al_2O_3$-layer had been brushed away along the very cutting edge, leaving there a smooth $Al_2O_3$-surface. Coating thickness measurements on cross sectioned, brushed inserts showed that the outermost TiN-layer and roughly half the $Al_2O_3$-layer had been removed along the edge line.

Inserts from D and C were tested in face milling of grey cast iron cylinder heads.

| | |
|---|---|
| Operation: | Face milling - roughing |
| Work-piece: | Cylinder head |
| Material: | Pearlitic grey cast iron, alloyed, |
| Cutting speed: | 116 m/min |
| Feed rate/tooth: | 0.32 μm/rev. |
| Depth of cut: | 1.5-2 μm |
| Insert-style: | TNEF 1204AN-CA |
| Note: | Wet, 13 teeth, unstable tendencies |
| Results: | Tool-life, number of component per edge set |
| Grade D: (invention) | 685 |
| Grade C: (prior art) | 475 |

Tool-life criterion was edge break-out on the work pieee due to chipping and high flank wear of the edges.

EXAMPLE 3

E. Cemented carbide milling inserts in accordance with the invention, identical to the inserts described in D (Example 2), except for that the coating not was brushed.

Inserts from D and E were tested in face milling of grey cast iron cylinder heads.

| | |
|---|---|
| Operation: | Face milling - roughing |
| Work-piece: | Cylinder head |
| Material: | Pearlitic grey cast iron, alloyed, |
| cutting speed: | 116 m/min |
| Feed rate/tooth: | 0.32 μm/rev. |
| Depth of cut: | 1.5-2 μm |
| Insert-style: | TNEF 1204AN-CA |
| Note: | Wet, 13 teeth, unstable tendencies |
| Results: | Tool-life, number of component per edge set |
| Grade D: (invention) | 685 |
| Grade E: (outside invention) | 570 |

Tool-life criterion was edge break-out on the work piece due to chipping and high flank wear of the edge.

F. Cemented carbide milling inserts in accordance with the invention with the composition 7.6 wt. % Co, 1.25 wt. % TaC, 0.30 wt. % NbC and balance WC with a grain size in average of 1.79 μm, with a binder phase alloyed with W corresponding to a CW-ratio of 0.86 were coated with a 0.5 μm equiaxed $TiC_{0.05}N_{0.95}$-layer (with a high nitrogen content corresponding to an estimated C/N-ratio of 0.05) followed by a 2.7 μm thick $TiC_{0.54}N_{0.46}$-layer, with columnar grains by using MTCVD-technique (temperature 850–885° C. and $CH_3CN$ as the carbon/nitrogen source). In subsequent steps during the same coating cycle, a 1.2 μm thick layer of $Al_2O_3$ was deposited using a temperature 970° C. and a concentration of $H_2S$ dopant of 0.4% as disclosed in U.S. Pat. No. 5,674,564. A thin (0.8 μm) layer of TiN was deposited on top according to known CVD-technique. XRD-measurement showed that the $Al_2O_3$-layer consisted of 100% κ-phase.

The coated inserts were brushed using a nylon straw brush containing SiC grains. Examination of the brushed inserts in a light optical microscope showed that the outermost, thin TiN-layer and some of the $Al_2O_3$-layer had been brushed away along the very cutting edge, leaving there a smooth $Al_2O_3$-surface. Coating thickness measurements on cross sectioned, brushed inserts showed that the outermost TiN-layer and roughly half the $Al_2O_3$-layer had been removed along the edge line.

G. Commercial cemented carbide milling inserts with the composition of 8 wt-% Co, 0.1 wt-% TiC, 1.7 wt-% TaC, 0.1 wt-% NbC, and balance WC and CW-ratio of 0.86. The WC-grain size was 1.74 μm. The inserts were coated with a 0.5 μm TiN-layer followed by a 1.5 μm thick TiC-layer and finally followed by a 0.5 μm TiN-layer.

H. Commercial cemented carbide cutting inserts with the composition of 8 wt. % Co, 0.1 wt. % TiC, 1.8 wt. % TaC, 0.1 wt. % NbC and balance WC, CW-ratio of 0.86 and WC-grain size 1.71 μm were coated with a 5 μm TiAlN-layer deposited by PVD-technique.

Inserts from F, G and H were tested in face milling of an alloyed pearlitic grey cast iron cylinder head.

| | |
|---|---|
| Operation: | Face milling - roughing |
| Work-piece: | Cylinder head |
| Material: | Pearlitic grey cast iron, alloyed, |
| Cutting speed: | 116 m/min |
| Feed rate/tooth: | 0.32 μm/rev. |
| Depth of cut: | 2 μm |
| Insert-style: | TNEF 1204AN |
| Note: | Wet, single tooth milling |
| Results: | Tool-life number of passes per edge |
| Grade F: (invention) | 78 |
| Grade G: (prior art) | 60 |
| Grade H: (prior art) | 58 |

Tool-life criterion was chipping and edge fractures of the edges.

EXAMPLE 5

I. Cemented carbide milling inserts in accordance with the invention with the composition 7.6 wt. % Co, 1.25 wt. % TaC, 0.30 wt. % NbC and balance WC with a grain size in average of 1.75 μm, with a binder phase alloyed with W corresponding to a CW-ratio of 0.90 were coated with a 0.5 μm equiaxed $TiC_{0.05}N_{0.95}$-layer (with a high nitrogen content corresponding to an estimated C/N-ratio of 0.05) followed by a 2.7 μm thick $TiC_{0.54}N_{0.46}$-layer, with columnar grains by using MTCVD-technique (temperature 850–885° C. and $CH_3CN$ as the carbon/nitrogen source). In subsequent steps during the same coating cycle, a 1.7 μm thick layer of $Al_2O_3$ was deposited using a temperature 970° C. and a concentration of $H_2S$ dopant of 0.4% as disclosed in U.S. Pat. No. 5,674,564. A thin (0.7 μm) layer of TiN was deposited on top according to known CVD-technique. XRD-measurement showed that the $Al_2O_3$-layer consisted of 100% κ-phase.

The coated inserts were brushed using a nylon straw brush containing SiC grains. Examination of the brushed inserts in a light optical microscope showed that the outermost, thin TiN-layer and some of the $Al_2O_3$-layer had been brushed away along the very cutting edge, leaving there a smooth Al203-surface. Coating thickness measurements on cross sectioned, brushed inserts showed that the outermost TiN-layer and roughly half the $Al_2O_3$-layer had been removed along the edge line.

Inserts from I and G were tested in face milling of pearlitic grey cast iron engine blocks.

| | |
|---|---|
| Operation: | Face milling - roughing |
| Work-piece: | Engine block |
| Material: | Pearlitic gray cast iron, un-alloyed |
| Cutting speed: | 106 m/min |
| Feed rate/tooth: | 0.20 μm/rev |
| Depth of cut: | 3 μm |
| Insert-style: | TNEF 1204AN |
| Note: | Wet milling, 56 teeth per set |
| Results: | Tool-life, number of components per set |
| Grade I: (invention) | 975 |
| Grade G: (prior art) | 700 |

Tool-life criterion was edge break-out on the work piece due to chipping and high flank wear of the edges.

EXAMPLE 6

Inserts from I and B were tested in face milling of pearlitic nodular cast iron gearbox housing.

| | |
|---|---|
| Operation: | Face milling - roughing |
| Work-piece: | Gear box housing. |
| Material: | Pearlitic nodular cast iron, alloyed |
| Cutting speed: | 137 m/min |
| Feed rate/tooth: | 0.15 μm/rev. |
| Depth of cut: | 5 μm |
| Insert-style: | TNEF 1204AN-CA |
| Note: | Wet milling, 20 teeth, unstable tendencies |
| Results: | Tool-life, minutes of tool life per edge set |
| Grade I: (invention) | 105 |
| Grade B: (prior art) | 60 |

Tool-life criterion was crack formation and chipping of the edges.

EXAMPLE 7

Inserts from I and C were tested in face milling of nodular cast iron engine block component

| | |
|---|---|
| Operation: | Face milling - roughing |
| Work-piece: | Engine block, bearing part |
| Material: | Nodular cast iron |
| Cutting speed: | 93 m/min |
| Feed rate/tooth: | 0.25 μm/rev |
| Insert-style: | TNEF 1204AN-CA |
| Note: | Wet milling, 26 teeth |
| Results: | Tool-life, number of components per edge set |
| Grade I: (invention) | 38000 |
| Grade C: (prior art) | 20000 |

Tool-life criterion was burr and spalling on the work piece.

What is claimed is:

1. A method of making a milling insert comprising a cemented carbide body and a coating wherein the WC-Co-based cemented carbide body comprises WC, 7.3–7.9 wt. % Co and 1.0–1.8 wt. % cubic carbides of Ta and Nb and a highly W-alloyed binder phase with a CW-ratio of 0.86–0.94, the method comprising the steps of:

depositing by a CVD-method a first, innermost layer of $TiC_xN_yO_z$ with x+y+z=1, y>x and z<0.2 having an equiaxed grain structure with a size <0.5 μm and a total thickness of 0.1–1.5 μm;

depositing by a MTCVD-technique a layer of $TiC_xN_y$ with x+y=1, x>0.3 and y>0.3 with a thickness of 1–4 μm having a columnar grain structure with an average diameter of <5 μm, wherein the MTCVD-technique uses acetonitrile as a source of carbon and nitrogen for forming a layer in a temperature range of 700–900° C.;

depositing a layer of a smooth κ-$Al_2O_3$ with a thickness of 1–2.5 μm; and depositing an outer layer of TiN with a thickness of 0.5–1.0 μm.

2. The method according to the claim 1, wherein the cemented carbide body contains 1.4–1.7 wt. % carbides of Ta and Nb.

3. The method according to claim 1, further comprising the step of removing the outer layer of TiN along a cutting edge.

4. The method of making a milling insert of claim 1, wherein the first, innermost layer of $TiC_xN_yO_z$ has y>0.8 and z=0.

5. The method of making a milling insert of claim 1, wherein the layer of $TiC_xN_y$ has x≧0.5.

6. A method of wet milling comprising the steps of:

providing a cutting tool insert comprising a cemented carbide body comprising WC, 7.3–7.9 wt. % Co, 1.0–1.8 wt. % cubic carbides of Ta and Nb, and a highly W-alloyed binder phase with a CW-ratio of 0.86–0.94, a coating comprising a first, innermost layer of $TiC_xN_yO_z$ with x+y+z=1, y>x and z<0.2 having an equiaxed grain structure with a size <0.5 μm and a total thickness of 0.1–1.5 μm, a layer of $TiC_xN_y$ with x+y=1, x>0.3 and y>0.3 with a thickness of 1–4 μm having a columnar grain structure with an average diameter of <5 μm, a layer of a smooth, fine-grained, 0.5–2 μm κ-$Al_2O_3$ with a thickness of 1–2.5 μm, and an outer layer of TiN with a thickness of 0.5–1.0 μm;

operating the cutting tool insert at a speed of 70–180 m/min; and feeding at a rate of 0.1–0.4 μm/tooth, wherein the wet milling is wet milling a cast iron, a compacted graphite iron or a nodular iron.

7. The method of claim 6, wherein the cast iron is a grey cast iron.

*8. The method according to claim 1, wherein an average grain size of the WC is about 1.5–2.5 μm.*

*9. The method according to claim 8, wherein the average grain size of the WC is about 1.8 μm.*

*10. The method according to claim 1, wherein the thickness of the $TiC_xN_y$ layer is 2-2.7 μm.*

*11. The method according to claim 1, wherein the average diameter of the columnar grain structure of the $TiC_xN_y$ layer is 0.1–2 μm.*

*12. The method according to claim 1, wherein the thickness of the layer of κ-$Al_2O_3$ is 1.2-1.7 μm.*

*13. The method according to claim 1, wherein the outer layer of TiN is removed along a cutting edge.*

*14. The method according to claim 13, wherein the layer of κ-$Al_2O_3$ is at least partly removed along the cutting edge.*

*15. The method according to claim 1, comprising wet-blasting the coating surface with a fine-grained alumina powder or brushing the edges with a brush.*

*16. The method of claim 6, wherein the outer layer of TiN is removed along a cutting edge.*

*17. The method of claim 16, wherein the layer of κ-$Al_2O_3$ is at least partly removed along the cutting edge.*

* * * * *